United States Patent
Ramavajjala et al.

(10) Patent No.: US 10,500,693 B2
(45) Date of Patent: Dec. 10, 2019

(54) RUN-TO-RUN CONTROL FOR CHEMICAL MECHANICAL PLANARIZATION

(75) Inventors: Madhu Sudan Ramavajjala, Plano, TX (US); Prakash Lakshmikanthan, Farmers Branch, TX (US); Patrick David Noll, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1574 days.

(21) Appl. No.: 13/440,412

(22) Filed: Apr. 5, 2012

(65) Prior Publication Data

US 2013/0267148 A1    Oct. 10, 2013

(51) Int. Cl.
*B24B 37/005*    (2012.01)
*B24B 37/04*    (2012.01)
*H01L 21/66*    (2006.01)

(52) U.S. Cl.
CPC .......... *B24B 37/005* (2013.01); *B24B 37/042* (2013.01); *H01L 22/12* (2013.01); *H01L 22/20* (2013.01)

(58) Field of Classification Search
CPC ....... H01L 22/20; H01L 22/12; B24B 37/005; B24B 37/042
USPC .......................................................... 451/5
See application file for complete search history.

(56) References Cited

U.S. PATENT DOCUMENTS

| | | | |
|---|---|---|---|
| 5,643,050 A * | 7/1997 | Chen ..................... | B24B 37/015 451/10 |
| 6,564,116 B2 | 5/2003 | Wang et al. | |
| 6,623,333 B1 | 9/2003 | Patel et al. | |
| 6,857,938 B1 * | 2/2005 | Smith et al. ..................... | 451/5 |
| 2002/0058460 A1 * | 5/2002 | Lee et al. ........................ | 451/5 |
| 2003/0022596 A1 * | 1/2003 | Meyer ............................. | 451/5 |
| 2003/0186621 A1 * | 10/2003 | Lin et al. ........................ | 451/5 |
| 2008/0081540 A1 * | 4/2008 | Sato .................. | H01L 21/67219 451/28 |

* cited by examiner

*Primary Examiner* — Sean K. Hunter
*Assistant Examiner* — Joel D Crandall
(74) *Attorney, Agent, or Firm* — Tuenlap Chan; Charles A. Brill; Frank D. Cimino (57) ABSTRACT

A method for fabricating an integrated circuit includes providing a partitioned chemical-mechanical planarization (CMP) model having a plurality of model parameters that include (i) device specific model parameters and (ii) at least one common parameter. (i) include a pre-CMP thickness of a film including a first material on an in-process device, a post-CMP target thickness for the film on the in-process device, and device group properties that account for device structure for the in-process device. (ii) includes a polish rate from an unpatterned pilot wafer having a second material thereon. The second material need not be the same as the first material. The polish time is automatically determined using the partitioned CMP model. A CMP process is performed on a patterned product wafer having a plurality of the in-process devices using a recipe including the polish time.

5 Claims, 6 Drawing Sheets

RUN-TO-RUN CONTROL FOR CHEMICAL MECHANICAL PLANARIZATION

FIELD

Disclosed embodiments relate to chemical-mechanical planarization.

BACKGROUND

Chemical Mechanical Polishing or Chemical Mechanical Planarization (CMP) is a process used to manufacture semiconductor wafers. CMP uses an abrasive and corrosive chemical slurry (commonly a colloid) in conjunction with a polishing pad and retaining ring, typically of a greater diameter than the wafer. The pad and wafer are pressed together by a dynamic polishing head and held in place by the retaining ring. The dynamic polishing head is rotated with different axes of rotation (i.e., not concentric). This action removes material and tends to even out any irregular topography, making the wafer essentially flat (or planar).

Polish time is generally an important CMP parameter which is based on the estimate of a planar end-point. However, conventional CMP control methods do not accurately account for multiple tool and process parameters such as film type, tool differences, new devices, and consumable changes over their life. Specifically, the polish rate is known to change with consumable life (e.g., pad life), is non-linear, and varies with the tool. This affects chart targeting and centering (CPk).

For example, for dielectric CMP, each dielectric (e.g., oxide) film change on the tool requires qualification of the CMP tool by first running a pilot (unpatterned) wafer with the particular dielectric to be polished thereon. Pilot wafers increase the cycle time (CT) and result in increased cost. Moreover, every new product device requires a look-ahead wafer to set the device specific polish rate which is known to vary based on the pattern density on the particular device. This affects both CT and cost. Although some polish time prediction equations are known, such known polish time prediction equations do not include a post CMP target, which can cause confusion when setting up new CMP process flows.

SUMMARY

Disclosed embodiments include methods for fabricating an integrated circuit (IC) including a chemical-mechanical planarization (CMP) method having a partitioned CMP model for polishing a plurality of different films such that common information (for example rate, consumable life, etc.) is shared while device specific information (for example device specific offsets, correlation factors, etc.) are kept separate. Disclosed embodiments include tuning the partitioned CMP model using post-CMP production data, such as using a cumulative sum (CUSUM) methodology in one particular embodiment.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1:
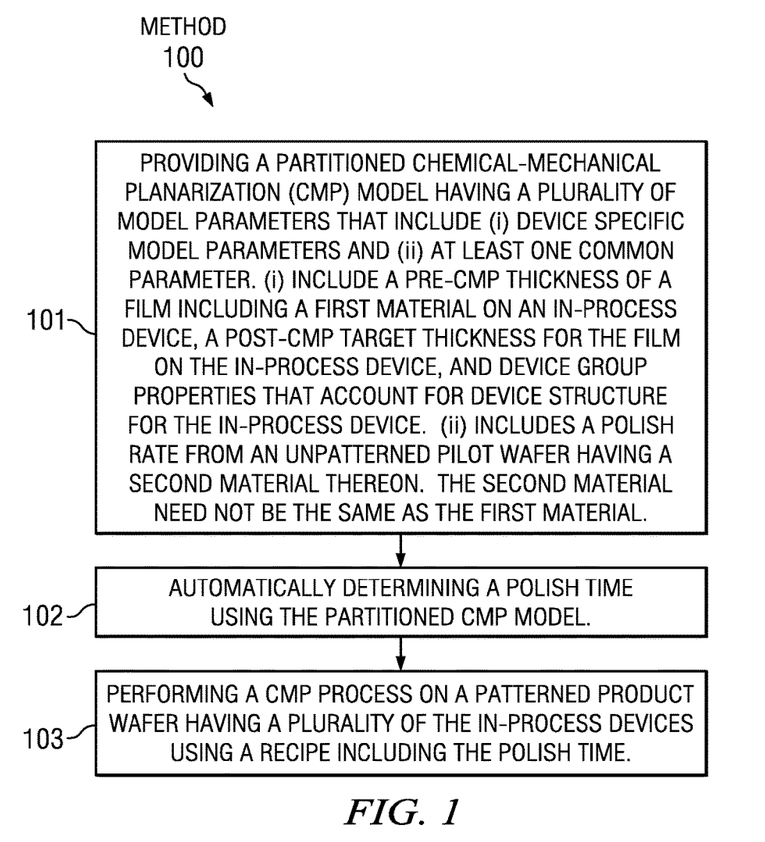
FIG. 1 is a flow chart that shows steps in an example method for fabrication an IC that includes CMP processing using a partitioned CMP model for run-to-run control of the CMP process including automatically determining the polish time, according to an example embodiment.

FIG. 1 is a flow chart that shows steps in an example method 100 for fabrication an IC that includes CMP processing using a partitioned CMP model for run-to-run control of the CMP process including automatically determining the polish time, according to an example embodiment. Method 100 is applicable to CMP of dielectrics, semiconductors, and metals, and is of particular utility for CMP processes that cannot be end-pointed (i.e., those CMP processes that stop somewhere within (e.g. near the middle) of the material layer being processed, that thus do not stop on another material), such as CMP of deposited oxides (e.g., silicon oxides). Disclosed methods can generally be applied to any film that cannot be end-pointed, provided the film has a reasonably consistent removal rate.

Step 101 comprises providing a partitioned CMP model having a plurality of model parameters that include (i) device specific model parameters and (ii) at least one common parameter. Device specific model parameters include a pre-CMP thickness of the film comprising a first material on an in-process device. The pre-CMP thickness is generally provided from one wafer per lot by a thickness measurement, such as obtained from a suitable metrology tool. A post-CMP target thickness for the film for the in-process device is included in the model which can be set by one or more individuals (e.g., technicians or engineers). For example, in the case of CMP of interlayer dielectric (ILD) for multi-level metallization, the post-CMP thickness can be measured on top of metal from previous level, which will be a non-zero ILD value. Device specific model parameters generally also include one or more device group properties that can account for pattern density or other device-specific structures for the in-process device.

Disclosed common parameters can include a polish rate obtained from an unpatterned pilot wafer having a top layer thereon comprising a second material. The pilot data need not be from a pilot wafer having the same first material as the in-process device, since qualification harmonization (i.e., reflected in correlation factors between different materials) in disclosed models can remove the need for the pilot wafer film to comprise the same first material that is on top of the in-process device. For example, different silicon oxide films may have several differing dopant concentrations or dopant species, but only one film's pilot data can be used in the model for polishing several different films.

The CMP model can further comprises a term that accounts for a non-linear decay of the polish rate with consumable life. Consumables can include the CMP pad, disk, polishing head and the slurry. The accounting for a non-linear decay of polish rate with consumable life can be specific for each polisher, using a common parameter shared by all films polished on each polisher. However, the model can accommodate this parameter as being different film to film. Moreover, the model coefficients for the non-linear decay parameter can be different from polisher-to-polisher.

Step 102 comprises using the partitioned CMP model to automatically determine a polish time for a patterned product wafer comprising a plurality of in-process devices having a top layer thereon comprising the first material. Step 103 comprises performing a CMP process using a slurry and a CMP recipe including the polish time determined in step 102. Disclosed CMP processes can be used with a wide variety of CMP tools including commercially available CMP tools, since disclosed CMP process models can be run by a process controller coupled to control CMP processing on the CMP tool.

Figure 5:
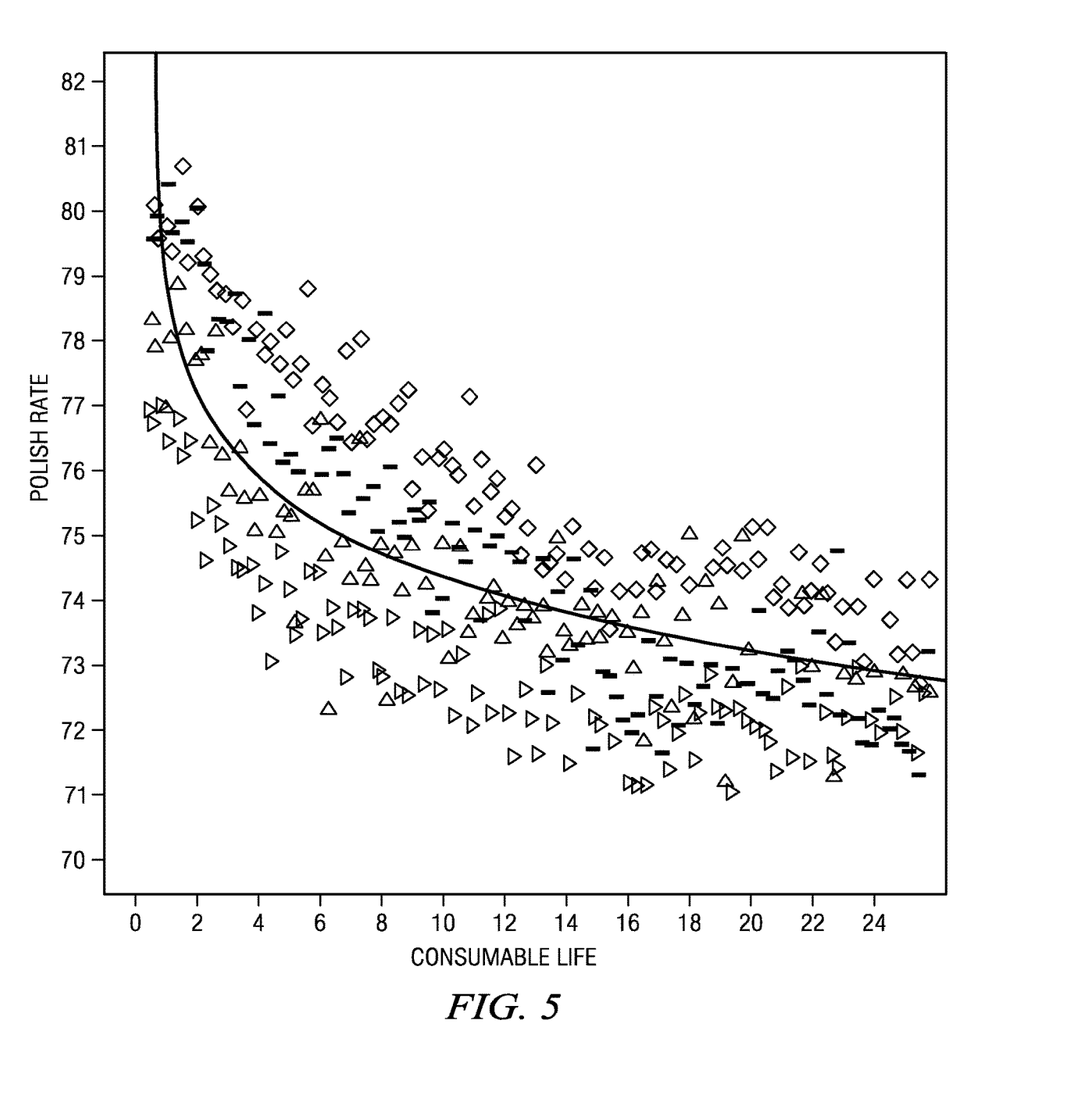
FIG. 5 shows polish rate decay as a function of consumable life (polishing pad time) for several polishers, according to an example embodiment.

In one embodiment the partitioned CMP model includes a polish time prediction equation (PTPE) that includes (i) device specific model parameters including a pre-CMP thickness of a film comprising a first material on an in-process device, a post-CMP target thickness for the film on the in-process device, and device group properties that account for device structure for the in-process device having the film thereon. The PTPE also includes (ii) at least one common parameter including a polish rate from an unpatterned pilot wafer having a second material thereon. An example disclosed PTPE is shown below:

$$\text{Polish time} = \{F^*(\text{PRETHICK} - \text{POST}tgt) + B\_DEV\} / \text{PilotRate} \quad \text{Equation 1:}$$

where:
i) F is a model coefficient (unitless) which is a function of metal pattern density on the in-process device and the particular film (e.g., TEOS oxide) being polished. F is thus a first device specific model parameter. A particular F-value can be shared by all devices in a group (e.g., one technology group having a pattern density in a relatively small range and one pattern level). The F values can also be shared value by all polishers in a fab (i.e., not polisher specific).
ii) PRETHICK is the pre-CMP incoming film (e.g., oxide) thickness, typically provided by earlier measurements that are recorded in the lot record.
iii) POSTtgt is the post-CMP target film thickness. In contrast to the PTPE above and disclosed polish time prediction equations, known/conventional polish time prediction models lack a post-CMP target film thickness.
iv) B_DEV (in units of thickness) is a model coefficient which accounts for variation between different devices that also captures some device specific information. B_DEV is thus a second device specific model parameter in the PTPE. For ILD polishing, B_DEV can be determined by the metal pattern density and device-specific structure such as die size, thickness of metal lines, dopant concentrations, etc. The model can estimate the B_DEV value from metal pattern density for polishing a film for a new device (a "seed" value) and then adaptively tunes the B_DEV value run-to-run based on a disclosed tuning algorithm (see tuner-related embodiment described below) for use on subsequent runs. The B_DEV seed value is generally a shared value by all polishers (not polisher specific). For example, a new device can be polished on any CMP machine using a B_DEV seed value in the model. The model can fine tune B_DEV based on post-CMP device measurements and use the new (tuned) value the next time the device is polished on a different CMP machine.
v) PilotRate is the polish rate as a function of the CMP Tool, consumable life, and the film, which represents a common parameter in the model. The PilotRate (in units of thickness/time) is generally determined by components including the feedforward of consumable life to account for a non-linear decay of polish rate with consumable life (se FIG. 5 described below), the film type (based on a correlation between different film types), feedback of prior pilot post-CMP data, and feedback of prior post-CMP production data (see tuner related embodiment described below). As noted above, consumables include CMP pad, disk, head life, and the slurry.

Figure 2:
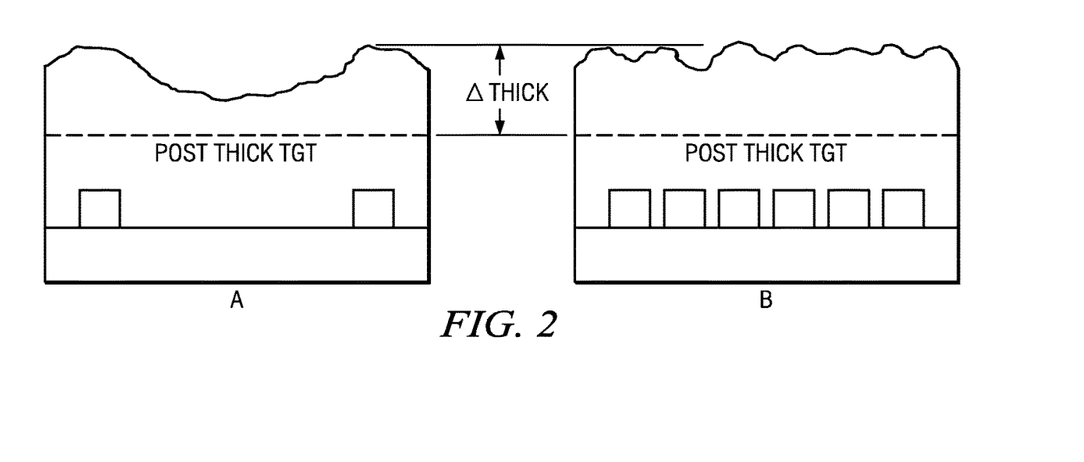
FIGS. 2A and 2B depict cross sections of devices with different Reticle Clear Density (RCD), but the same thickness to be removed.

FIGS. 2A and 2B depict cross sections of devices with different RCD, but the same thickness to be removed. Due to the topographical differences a larger volume of material is removed for the device in FIG. 2B as compared to the device in FIG. 2A. The volume of material removed is therefore a function of RCD. Since the volume of material is proportional to thickness, a term "Effective Thickness" can be derived as equal to the factor F times the (PRETHICK–POSTtgt) shown in the PTPE above, where F is a function of RCD. This effective thickness is thus the equivalent to thickness removed on an un-patterned pilot wafer.

Figure 3:
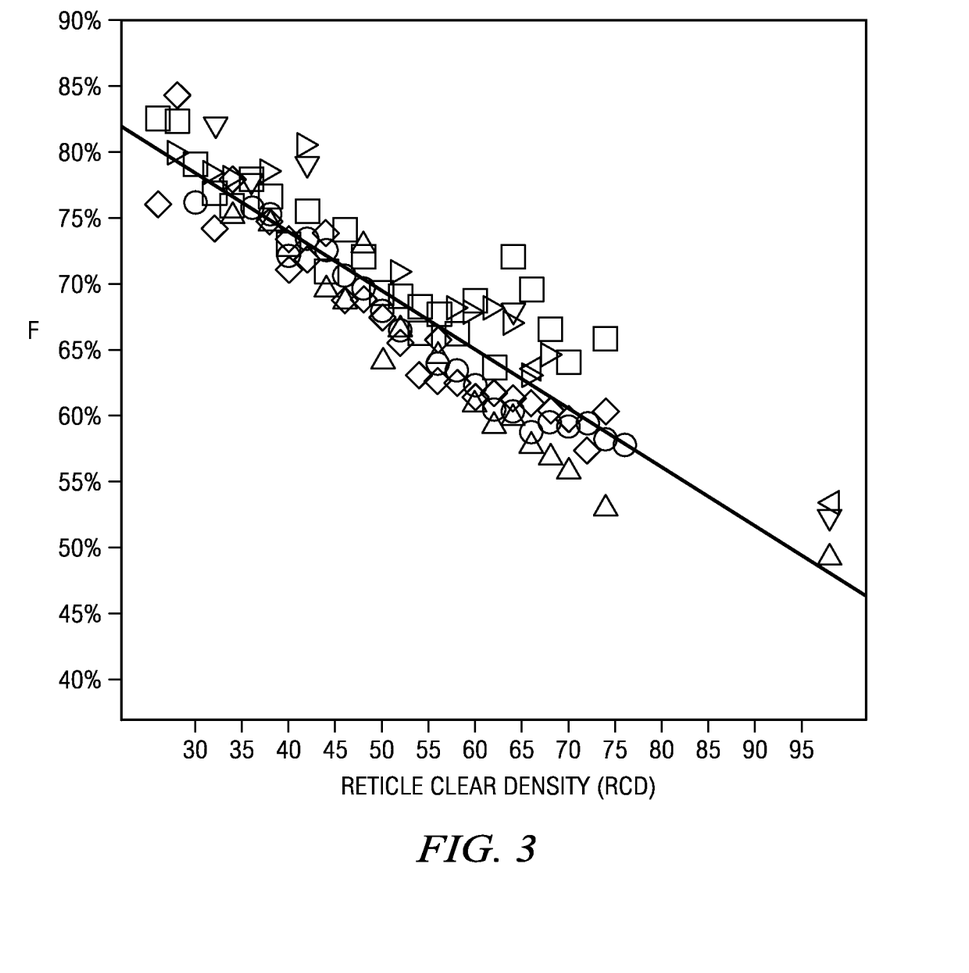
FIG. 3 shows the thickness modifying factor (F) as a function of RCD for silicon oxide CMP at multiple metal levels according to an example embodiment. F is shown to clearly be a linear function of RCD, and can thus be estimated for any new device.

FIG. 3 shows the thickness modifying factor (F) as a function of RCD for silicon oxide CMP at multiple metal levels. F is shown to clearly be a linear function of RCD, and can thus be estimated for any new device. Layers other than silicon oxides are expected to show a similar relation. RCD and pattern density are inversely related. RCD indicates the clear density and pattern density represents the chrome density of a reticle. Together they sum to 1 (or 100%). This behavior can be captured into a function such as B_DEV and F as well. F captures an average for a group (such as a technology/level) and B_DEV captures the delta from this average for a given device. The PTPE described above, or a similar equation, can thus eliminate the need to run look ahead wafers for new devices.

Figure 4:
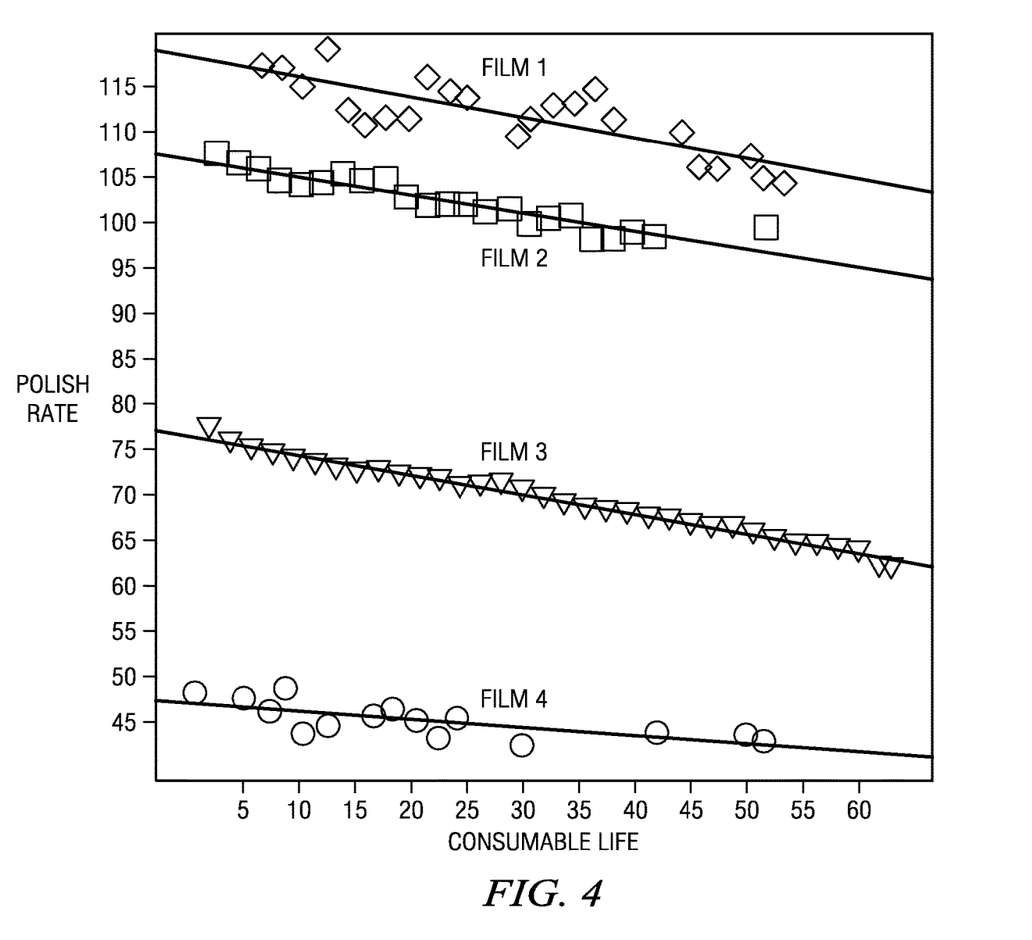
FIG. 4 is a plot that shows effective oxide removed as a function of Reticle Clear Density (RCD) for four different films (Films 1-4), according to an example embodiment.

FIG. 4 shows rate decay with consumable life for four different silicon oxide films (Films 1-4). Since the polish rate for all four oxide films is correlated, a single film qualification is sufficient to process any oxide film. Correlation factors between such films can be used to derive a polish rate when a new film is being processed.

FIG. 5 is a plot that shows polish rate decay with pad conditioner hours for several polishers. The polish rate for each tool can be seen to follow the same general trend, that being decaying exponentially during the first few hours and then decaying linearly to the end of its life. The polish rate decay across different films has been found to be similar and this behavior can be captured into a function such as PilotRate in the PTPE described above using correlation factors between films which can eliminate the need to qualify a CMP tool when there is a film change.

In a "high-mix" semiconductor manufacturing fabrication environment that runs a plurality of different in-process devices (different products), disclosed embodiments include procedures that allow the CMP controller run-to-run to keep track of each process disturbance separately and adaptively update the partitioned CMP model to provide corrected settings to the CMP tool for each in-process device. Disclosed embodiments recognize that there are multiple variation causing parameters referred to herein as "disturbances" that result in variations including polish rate differences for each CMP tool, polish rate changes with consumable life, underlying structural/topographical differences for the in-process device, such as between each product family and for various products within one family, etc. Generally a "lot" of wafers of a single in-process device (product) is polished on a single CMP tool, and then one or two wafers from this lot are measured after CMP to determine the post-CMP thickness. If the post-CMP measurements are exactly on target, then no model tuning is used. However, often the measurements are off-target by at least a small amount.

Disclosed embodiments include controllers that make an adjustment to the partitioned CMP model (referred to herein as tuning the model, or model tuning) based on post-CMP thickness data collected so that the next lot of wafers will be closer to the target. The post-CMP thickness data collected need not be from the same in-process device to improve the proximity (closeness) of the next lot of wafers to the target.

One design challenge for model tuning is parameter selection which asks for each run which CMP parameter(s) to tune. Another is the tuning gain selection, which in the presence of process and metrology noise, asks how much should each parameter be tuned. In addition, there is generally a multi-run tuning visibility problem, which asks how to extend the tuning visibility of each tunable parameter across multiple runs.

In the case of CMP processes there at least three main disturbances identified by the Inventors that can be accounted for by disclosed embodiments. These disturbances can be the following:
1. The polish rate as a function of the film. For example, different dielectric films, which have different physical (e.g., density) and/or chemical properties, will have different CMP polish rates.
2. The polish rate as a function of the consumable life for each tool.
3. The polish rate as a function of underlying structural/topographical properties (e.g., pattern density), particular each different in-process device.

Regarding the parameter selection problem, in some disclosed embodiments, for each run the parameter that has the highest probability of change is the parameter that is selected to tune the model. For example, for the first lot of wafers processed on a CMP tool that has recently had a consumable change (e.g., pad or slurry change), the error from target is most likely due to inaccurate estimation of the polish rate by the model. In this case an aggressive adjustment to the polish rate parameter of the model can be made. Another example is when a CMP tool that is tuned properly (as evidenced by post-CMP measurements that are very close to the target) produces a large error from the target for a product that has no history (i.e., a new product), then an aggressive adjustment is made only to the product offset (but not to the polish rate). The algorithm described below relative to the decision tree that implements a method of parameter selection for CMP tuning described below relative to FIG. 6 illustrates a method that handles two model tuning parameters, but can be extended to three or more model tuning parameters.

Regarding the tuning gain selection problem, the larger the tuner gain, the larger is the magnification of the system noise. The system noise is the part that is the unmeasured disturbance (or the white noise, or the steady state variance). Any tuning action that is greater than zero will increase the system noise. However, if the tuning gain is zero, it is not generally possible to bring a controller that is off-target back to the target. Therefore in order to minimize the steady state variance, a value of gain greater than zero, but as low as possible can be used. Many processes exhibit some drift from run-to-run. This is particularly true for CMP processes which exhibit a non-linear rate decay with consumable life (see FIG. 5 described above). If the tuning gain is too low then the controller cannot catch up to a drifting process and there is a bias. The system drift thus benefits from a controller gain as high as possible. This is in contrast to the steady state variance.

Figure 6:
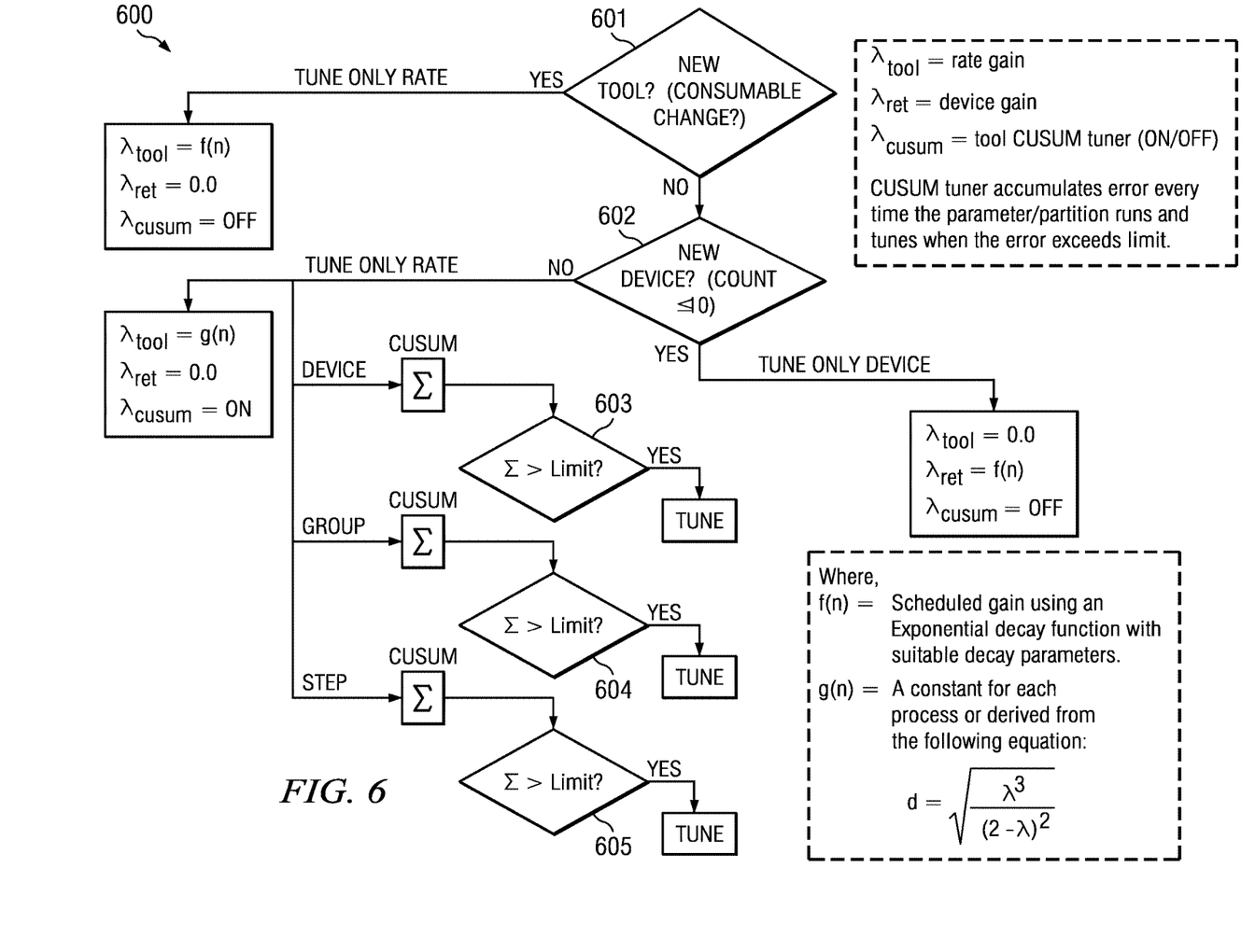
FIG. 6 is a decision tree that implements a method of parameter selection for CMP tuning using a CUSUM tuner, according to an example embodiment. For each lot measurement, only one parameter is tuned. CUSUM tuners track and adjust the performance of various parameters across multiple runs based on statistically derived limits.

The information provided to implement the decision tree method of parameter selection for CMP tuning using a CUSUM tuner shown in FIG. 6 includes error from post-CMP target data to estimate a tuning gain that will balance between the steady state variance requirement and the drift requirement. This or a related expression can be coded directly into the CMP controller or for most processes where the drift is known, or a constant value of tuning gain can be employed.

Regarding multi-run tuning visibility, consider the following example. Assume that a CMP tool has been processing multiple products and the last several runs produced an error from target that is one-sided (could be positive error or negative error). With each new lot that is processed on the current CMP tool, if the error from the target is on the same side, then the probability that there is some issue with the tool increases. A tuning adjustment can be made to a parameter that is related to the tool such as PilotRate described above so that the next lot will be closer to target. To determine this, the CMP controller will be provided some visibility across multiple lots to make a decision based on some objective criteria.

As another example, multiple tools are setup to process a product "xyz" and regardless of which tool xyz is processed on, it always produces one sided error from its post-CMP target. With each new lot of product xyz, if the error from target is on the same side of zero, then there is some consistent offset to be accounted for by the controller. Here again the CMP controller keeps track of performance for each product across multiple tools in order to make a decision based on some objective criteria.

In one example embodiment, a CUSUM tuner is used to track of performance for each product across multiple CMP tools in order to implement a decision based objective criteria for tuning a disclosed CMP model. A CUSUM tuning methodology aggregates the error for a plurality of parameter and tunes whenever the accumulated error exceeds a predetermined threshold. In statistical quality control, the CUSUM (or cumulative sum control chart) is a sequential analysis technique developed by E. S. Page of the University of Cambridge.

A CUSUM tuner accumulates the error from the post-CMP target for each run to form a sum S; $S=e_1+e_2+e_3+\ldots$, and can also accumulate error separately for each parameter. Parameters in this embodiment can represent the tool performance, each product performance, performance for a product family, performance by step in the process flow (e.g., ILD or metal 3), etc. The CUSUM tuner can tune the model when the cumulative error exceeds a statistically derived limit. Separate limits for each parameter can be setup as constants. A CUSUM tuner has been recognized to catch one-sided errors quickly.

CUSUM tuner concepts are captured in the example algorithm presented in the flow diagram shown in FIG. 6 for a decision tree that implements a method of parameter selection for CMP tuning 600 using a CUSUM tuner, according to an example embodiment. As shown in FIG. 6, $\lambda_{tool}$=tool gain, $\lambda_{ret}$=device gain, and $\lambda_{cusum}$=CUSUM tuner (ON/OFF). A separate CUSUM tuner can be setup for each parameter or model partitioning structure. As an example, the device CUSUM tuner accumulates error each time a device runs (per lot) and tunes whenever the total error exceeds predetermined limits as shown in FIG. 6. Step 601 considers whether the CMP tool is a new tool which as used herein includes a tool following preventive maintenance, such as a pad change. If the CMP tool is a new tool, only the tool specific polishrate is adjusted, with $\lambda_{tool}$ as a function f(n), with the other $\lambda$ values set to 0. Function f(n) is an exponential decay function with smaller values for each subsequent lots. If the CMP tool is not a new tool, the method moves to step 602.

Step 602 is shown asking whether the device being polished is a new device (no or short CMP history). If the device is not a new device, such as defined by a device count ≤10, only the tool is adjusted, with $\lambda_{tool}$ as a function of g(n), with the other $\lambda$ values set to 0. Respective CUSUM summers are shown accumulating device, group and step error. Steps 603, 604 and 605 compare the device, group and step CUSUMs to predetermined limits. If any of the CUSUMs are exceeded, tuning is initiated. If the device is a new device, only the device is adjusted, where a device gain $\lambda_{ret}$=f(n) is used, with the device, group and step CUSUM summers are kept off. An example f(n) is shown below, where n is the device count.

$$f(n) = \lambda_{init} \frac{(1+n)}{(1+n)^\alpha}$$

Where: $\lambda_{init}$=initial gain=0.75
n=device count
$\alpha$=1.733 (3× nominal error)

Tuner variance and bias can also be separated. MSD/$\sigma^2$ is the magnification of input noise ($\sigma$) by the controller. $\sigma$ is the standard deviation of the measurement noise. For a given drift rate there is a value of $\lambda$ that minimizes the MSD. Described below is a function that sets the tuning gain by minimizing the inupt noise.

An example expression for the mean square deviation from target (MSD) as a function of measurement noise ($\sigma$) is shown below. d is the process drfit per run divided by the standard deviation of the measurement noise ($\sigma$). The 2/(2−$\lambda$) term represents the steady state variance, while the d/$\lambda$ term represents the bias due to the rate drift term.

$$MSD = \sigma^2 \left[ \frac{2}{2-\lambda} + \left(\frac{d}{\lambda}\right)^2 \right]$$

-continued $$d = \sqrt{\frac{\lambda^3}{(2-\lambda)^2}}$$

Figure 7:
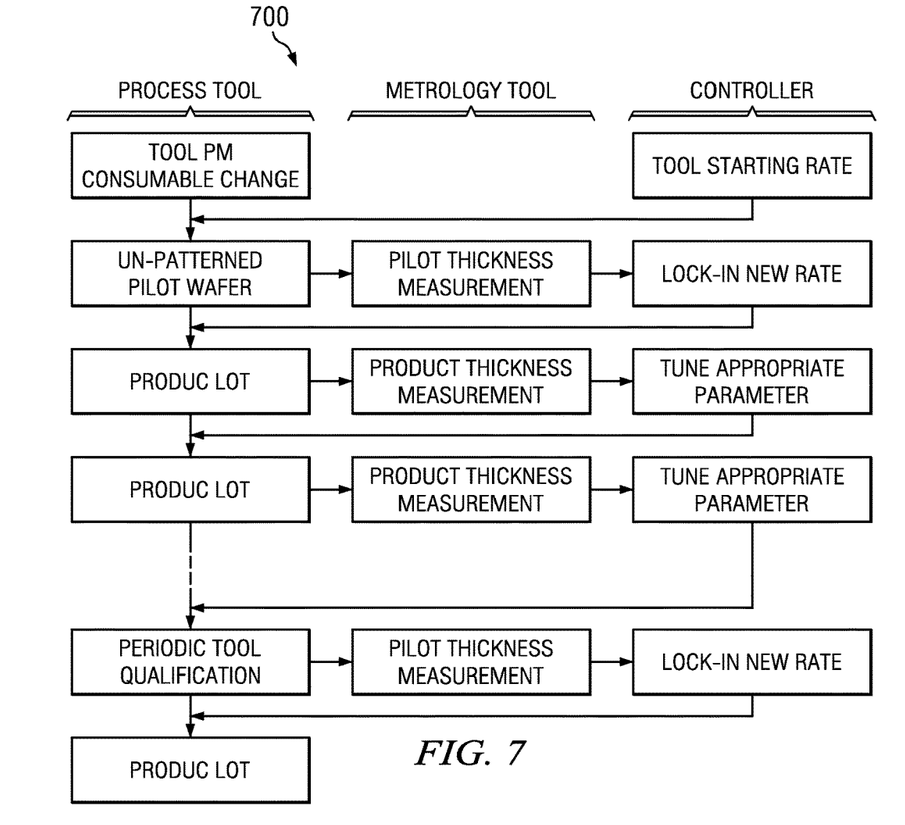
FIG. 7 is an example process flow diagram showing various interactions between process tool parameters, metrology tool parameters, and polish time controller parameters, according to an example embodiment
Figure 8:
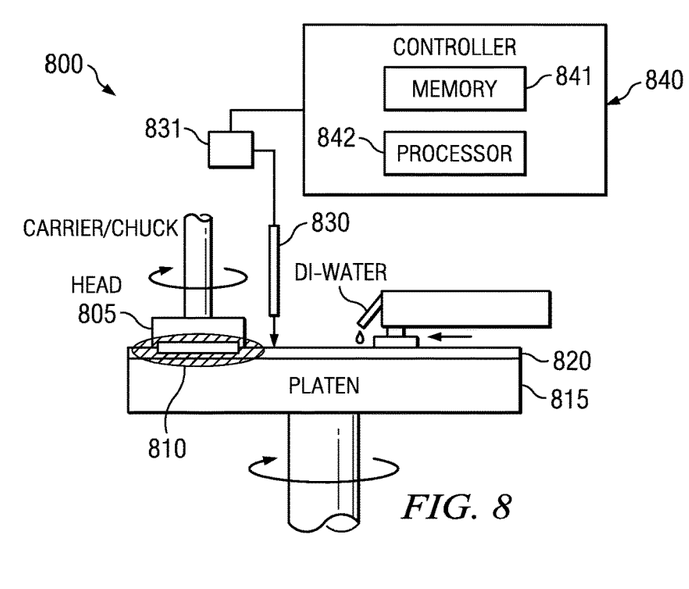
FIG. 8 is a simplified depiction of a CMP apparatus according to an embodiment of the invention comprising an example disclosed process controller programmed to run a disclosed partitioned CMP model for run-to-run control of a CMP process, according to an example embodiment.

FIG. 7 is an example process flow diagram 700 showing various interactions between process tool parameters, metrology tool parameters, and polish time controller parameters, according to an example embodiment. FIG. 8 is a simplified depiction of CMP apparatus 800 according to an example embodiment comprising a disclosed process controller 840 programmed to run a disclosed partitioned CMP model for run-to-run control of a CMP process, according to an example embodiment. Apparatus 800 includes a polishing head 805 for holding a wafer 810, a platen 815 and a polishing pad 820 on the platen 815 operable to polish the surface of the wafer 810. An inlet 830 including at least one control valve 831 is provided for delivering a slurry composition to the wafer 810.

Process controller 840 (e.g. microprocessor or microcontroller) comprises a writable memory 841 that provides tangible machine readable storage and a processor 842 coupled to utilize a disclosed partitioned CMP model stored in writeable memory 841. Controller 840 controls the control valve 831 to control delivery of the slurry composition onto a surface of the wafer 810, and other CMP process aspects including the polish time.

EXAMPLES

Disclosed embodiments are further illustrated by the following specific Examples of model tuning, which should not be construed as limiting the scope or content of this Disclosure in any way.

Example 1

A CMP tool comes back to production after a consumable change, such as a CMP pad change. During the first few runs the behavior of the CMP tool is somewhat unpredictable and therefore a parameter related to the CMP tool, such as PilotRate described above is adjusted preferentially over anything else. Once the CMP tool is dialed in properly as evidenced by minimal post-CMP target error, the tuning gain is scheduled normally.

Example 2

The first lot of a new product comes in with a large error from target on a CMP tool with good prior performance and no recent consumable change. This large error from target is likely due to lack of historical data for the new product and hence the product related offset is tuned preferentially over anything else, such as reflected in B_DEV described above. The second time the same product is processed the post-CMP error from target should be lower since the first run made an adjustment. To frame it from a statistical standpoint, the uncertainty reduces with each successive time a new product is processed. The uncertainty reduces exponentially and therefore the tuning gain is reduced exponentially for each successive run of the same product.

Example 3

A product with sufficient historical data is currently being processed on a CMP tool which did not have a recent consumable change. In this case the most likely culprit for the error from target is the tool parameter. Here engineering knowledge is used that recognizes CMP tools drift from run-to-run and it is possible that the controller may be lagging behind the process drift. In this situation the tool offset can be can be adjusted, such as using a gain described relative to FIG. 6 and reflected in the parameter PilotRate, described above. While no tuning occurs for other parameters, the error from target is added to the CUSUM of each parameter. This accumulates the error for each parameter separately and a separate tuning could be made for each parameter based on a statistical limit. This is illustrated in the lower left of FIG. 6.

Advantages of disclosed embodiments include more accurate estimation of polish time for each lot, and as a result, higher yield due to a reduction in both under-polish and over-polish. Improved cycle time and CMP tool availability is provided by eliminating most conventional qualification activities including look ahead runs and single qualification per tool for every different film. Reduced qualification activities also prolong the life of consumables which reduces the cost of operation.

Disclosed embodiments can be integrated into a process flows to form a variety of different semiconductor integrated circuit (IC) devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A method for fabricating an integrated circuit, comprising:
    providing a partitioned chemical-mechanical planarization (CMP) model having:
    (i) device specific model parameters including:
        a pre-CMP thickness of a film covering an in-process device,
        a post-CMP target thickness for said film covering said in-process device, and
        a device group property of said in-process device including a metal pattern density, and
    (ii) a common model parameter including a polish rate from an unpatterned pilot wafer;
    determining a polish time by applying said partitioned CMP model to a patterned product wafer, the applying including:
        deriving a coefficient based on the metal pattern density; and
        multiplying the coefficient with a difference between the pre-CMP thickness and the post-CMP thickness; and
    performing a CMP process on a patterned product wafer using a slurry and a CMP recipe based on said polish time.

2. The method of claim 1, wherein said common parameter comprises a non-linear decay of said polish rate associated with a consumable life of a CMP tool.

3. The method of claim 1, further comprising tuning said partitioned CMP model using post-CMP production data.

4. The method of claim 3, wherein said tuning said partitioned CMP model includes determining a single one of said plurality of model parameters to tune for each run.

5. The method of claim 4, wherein said tuning comprises accumulating errors for at least two said plurality of model parameters when the accumulated error exceeds a predetermined threshold.

* * * * *